United States Patent [19]

Gulczynski

[11] Patent Number: 4,829,263

[45] Date of Patent: May 9, 1989

[54] HIGH SPEED INSTRUMENTATION AMPLIFIER WITH MINIMIZED OFFSET VOLTAGE AND DRIFT

[76] Inventor: Zdzislaw Gulczynski, P.O. Box 441, Winchester, Mass. 01890

[21] Appl. No.: 180,434

[22] Filed: Apr. 12, 1988

[51] Int. Cl.$^4$ .......................... H03F 1/02; H03F 3/68
[52] U.S. Cl. .......................................... 330/9; 330/51; 330/124 R; 330/295
[58] Field of Search .................. 330/9, 51, 124 R, 295

[56] References Cited
U.S. PATENT DOCUMENTS 4,596,956  6/1986  Gardner ................................. 330/9

Primary Examiner—James B. Mullins

[57] ABSTRACT

The instrumentation amplifier with minimized offset voltage and drift has a very high speed and accuracy. One voltage controlled amplifier operating under open loop condition is interchangeably amplifying the input signal and providing the output signal. Simultaneously, a comparator circuit is automatically correcting the gain and error voltage of another voltage controlled amplifier by adjusting voltages across two capacitors coupled thereto. The accuracy of a reference source, passive components and on-resistance of switches is not essential. Amplifiers with FET input stages and an output buffer amplifier can be employed. The gain of the instrumentation amplifier is set by a voltage or digitally.

9 Claims, 3 Drawing Sheets

HIGH SPEED INSTRUMENTATION AMPLIFIER WITH MINIMIZED OFFSET VOLTAGE AND DRIFT

CROSS REFERENCE TO RELATED INVENTIONS

This application is related to: "Ultra Fast Logic," Ser. No. 180,431, filed herewith; "Analog Power Ampliefier," Ser. No. 180,432, filed herewith; "High Efficiency Power Amplifier Comprising Multilevel Power Supply," Ser. No. 180,433, filed herewith; "Operational Amplifier," U.S. Pat. No. 4,749,958, dated 06/07/88; "Power Amplifier," U.S. Pat. No. 4,782,306, dated 11/01/88; "Operational Amplifier or Comprator Circuit with Minimized Offset Voltage and Drift," U.S. Pat. No. 4,749,953, dated 06/07/88; "Operational Amplifier," U.S. Pat. No. 4,714,894, dated 12/22/87; "Operational Amplifier," U.S. Pat. No. 4,634,996, dated 01/06/87; and "Push-Pull Power Amplifier," U.S. Pat. No. 4,476,441, dated 10/09/84. All inventions are by the same inventor.

BACKGROUND OF THE INVENTION

The invention relates to a high speed instrumentation amplifier (IA) with minimized offset voltage and drift, particularly for signal amplification requiring very high speed and accuracy.

An instrumentation amplifier (IA) is a gain block having a pair of inputs for accurately amplifying an input signal applied thereacross. Conventional IAs include closed loop amplifiers each having gain determined by high accuracy resistors. The gain of the IAs is set by one or two external resistors. An inherent parasitic offset voltage is present between inputs of any IA and depends on temperature, represented by an offset drift, the level of the input signal, represented by a common mode rejection (CMR), and the frequency of the amplified input signal. Therefore, an error voltage present between the inputs of the IA is a momentary value of the offset voltage. The error voltage is generated in a number of stages of the IA by respective differential transistors, essentially due to a mismatch thereof.

Most common IAs incorporate three operational amplifiers and seven high accuracy resistors. The matching of the resistors must be precisely maintained over temperature and time in order to retain high gain accuracy and high CMR. Therefore, all resistors are formed with the integrated circuit, whereby the gain of the IA is selected by shorting respective terminals thereof. The gain is set by a single resistor Rg and is inversely proportional to the value thereof. Additional resistances such as of relays and sockets contribute to gain error as the value of Rg becomes small at high gains. The output impedance of the IA varies in a very wide range over frequency.

An optional offset adjustment is accomplished by means of a potentiometer coupled to additional terminals and affects only input stage components. Therefore, the null condition depends on the gain set. The offset voltage drift is affected by the amount of the offset voltage that is trimmed and cannot be nulled. Furthermore, the offset voltage and CMR adjustments are interactive and several iterations are required. Some IAs provide additional terminals for setting an ouput stage gain, output stage offset nulling, CMR trimming, etc. The offset performance is very difficult to maintain, especially at high gains. This may be caused by unequal temperature of input pins due to power dissipation of surrounding components. Air currents may result in rapid changes in the die temperature and thermocouple effects. Skirted heat sinks are used, although the IAs are predominantly low power devices.

Bipolar transistors are employed in the IA input stage as FETs are very difficult to match. The input stages with FETs also have a poor CMR which is further improved by an additional circuitry predetermining their drain-source voltage. The employment of the bipolar transistors results in relatively large input bias currents, wherein the transistors must operate at very low currents. A high circuit complexity further degrades an operational speed so that the conventional IAs are extremely slow.

SUMMARY OF THE INVENTION

The invention is intended to solve the above problems and therefore the object of the invention is to provide an IA retaining high accuracy and having a drastically increased speed. According to the invention an IA with a pair of voltage controlled amplifiers interchangeably amplifying the input signal and having automatically adjusted gain, offset voltage and drift solves these problems.

A comparator is employed for correcting the gain of the amplifiers and can be very slow. This has no effect on the operational speed of the IA since the amplification of the IA input signal is accomplished by one amplifier having gain already corrected. Voltage controlled amplifiers can be very fast as they operate under open loop condition. A linear dependence of the amplifier gain on the controlling voltage is not required as the gain is inherently corrected. The accuracy and stability of a reference source is insignificant since merely an equality of two voltages is determined by the comparator. The accuracy of passive components and on-resistance of switches are not essential. The output impedence of the IA remains relatively steady over wide frequency range. Specifically, an IA according to the present invention comprises a pair of amplifier means each having a pair of inputs, a terminal and an output, for amplifying a signal applied across the inputs at a gain controlled by a signal applied to the terminal, a pair of capacitive means separately coupled to the amplifier means terminals for storing the respective gain controlling signals, a source means for providing a reference signal, a comparator means having an input for comparing a signal applied thereto against the reference signal, and an output, an input switch means for applying an input signal of the IA across the inputs of at least one amplifier means or separately applying the input signal and the reference signal across the inputs of the amplifier means, and an ouput switch means for coupling the output of one amplifier means receiving the input signal of the IA for providing an output signal thereof, and for coupling the terminal and output of the other amplifier means to respectively the output and input of the comparator means.

In one embodiment, the IA includes a resistive means for dividing the first said reference signal and providing a plurality of third reference signals, and a multiplexer means for selecting one of the third reference signals in response to a digital signal and providing a second reference signal to the input switch means.

In another embodiment at least one amplifier means exhibits an error voltage between the inputs thereof, and the IA further includes a second capacitive means coupled in series with one input of the one amplifier means for storing the error voltage thereof, a second switch means for coupling the second capacitive means across the inputs of the one amplifier means and coupling the comparator means output to the one input thereof, and a third switch means for substituting the reference signal applied to the comparator means for ground.

BRIEF DESCRIPTION OF THE DRAWINGS

The present invention will become more clear in conjunction with the accompanying figures of which.

Throughout the drawings, similar references denote similar parts.

DETAILED DESCRIPTION OF THE INVENTION

Figure 1:
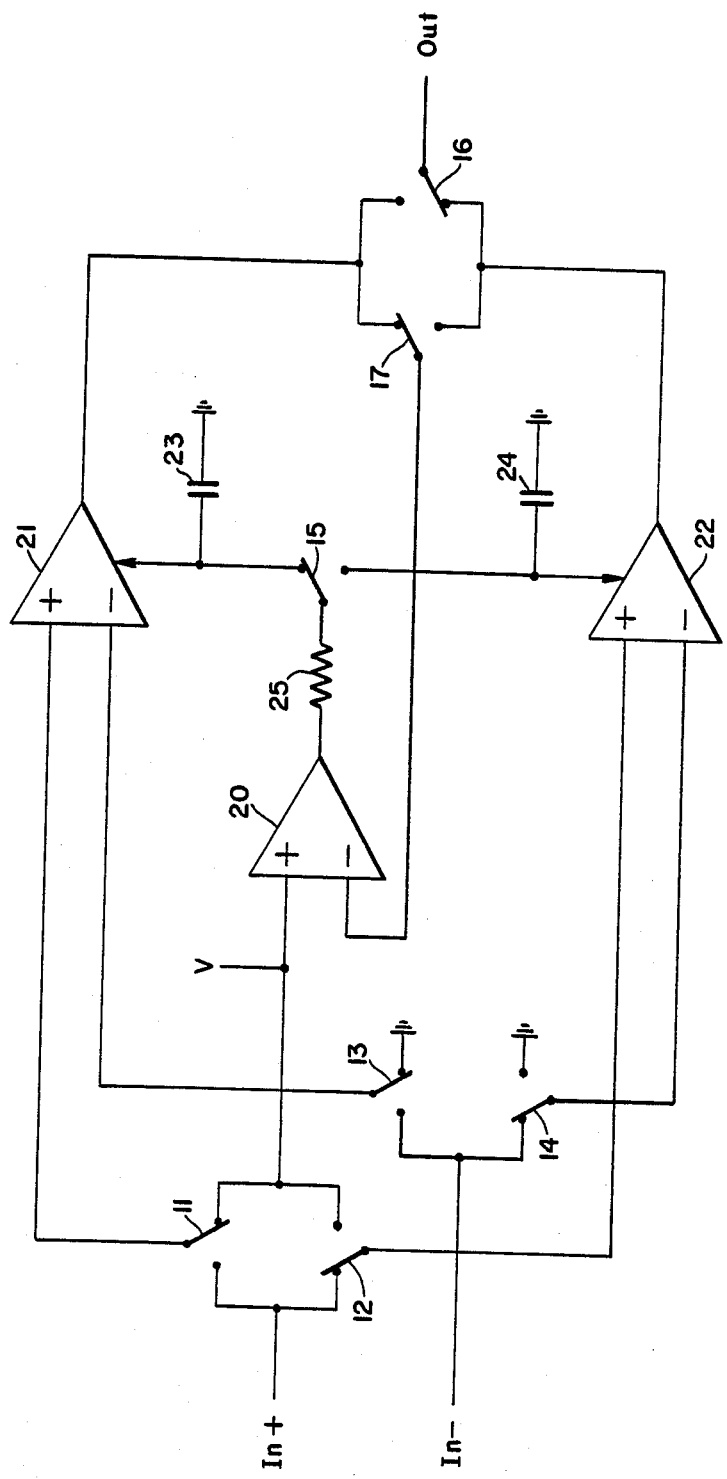
FIG. 1 is an embodiment of a unity gain IA.

FIG. 1 is an embodiment of a unity gain IA. Generally, the IA includes a pair of voltage controlled amplifiers and a comparator circuit. One of the amplifiers is amplifying the input signal and providing the output signal of the IA, wherein the voltage determining the gain of the amplifier is stored in a capacitor coupled thereto. Simultaneously, the comparator circuit is correcting the gain of the other amplifier by correcting a voltage across another capacitor, coupled thereto. The input switch means of the IA includes two pairs of switches, each pair separately coupled to the pairs of the amplifier inputs for alternately applying thereacross a reference signal or the input signal of the IA. The output switch means couples the output of one amplifier receiving the IA input signal to the IA output and also couples the other amplifier means to the comparator circuit.

Specifically, FIG. 1 shows the IA with the input signal applied via the switches 12 and 14 to respectively the noninverting and inverting inputs of the amplifier 22. The output thereof is coupled via the switch 16 to the output of the IA for providing the output signal thereof. The voltage determining the gain of the amplifier 22 is stored in the capacitor 24 coupled thereto.

Concurrently, the reference voltage of the source V is applied to the amplifier 21, wherein the noninverting and inverting inputs thereof are coupled to the source V and ground via the switches 11 and 13 respectively. The output voltage of the amplifier 21 is applied via the switch 17 to the inverting input of the comparator 20. The noninverting input thereof is coupled to the source V.

The output of the comparator 20 is coupled via the resistor 25 and switch 15 to the grounded capacitor 23. The voltage thereacross determines the gain of the amplifier 21. The comparator 20 compares the output voltage of the amplifier 21 with the reference voltage of the source V, wherein its binary output signal is filtered by the resistor 25 and capacitor 23. Assuming that voltage thereacross and the according gain of the amplifier 21 both change in the same direction, a negative feedback is established. Thereby, the unity gain of the amplifier 21 is obtained and a voltage substantially equal to the reference voltage appears at the output thereof. The comparator 20 is held at its switching point and oscillates, whereby the voltage across the capacitor 23 is stable.

The correction may be now terminated. Subsequently, the switches 11 thru 17 are switched so that the functions of the amplifiers 21 and 22 are interchanged. Specifically, the amplifier 21 is then amplifying the input signal and providing the output signal of the IA while the comparator 20 is correcting the gain of the amplifier 22 by altering the voltage across the capacitor 24. The switches 11 through 17 can be also switched periodically.

The comparator 20 is employed for correcting the gain of the amplifiers 21 and 22, and can be very slow. This has no effect on the operational speed of the IA since the amplification of the IA input signal is accomplished by one amplifier having gain already corrected. Essentially, the gain will deteriorate only due to temperature changes which are very slow. Voltage controlled amplifiers can be very fast as they operate under open loop condition. Moreover, a linear dependence of the amplifier gain on the controlling voltage is not required as the gain is inherently corrected.

The accuracy and stability of the source V providing the reference voltage is insignificant since merely an equality of two voltages is determined by the comparator 20. However, the reference voltage should be substantially different from the offset voltage of the comparator 20. The tolerance of the passive components 23 thru 25 is not critical. Widely available high speed switching components can be used. The on-resistance of the switches 11 thru 15 is insignificant. The switch 16 or 17 is coupled in series with the output signal of the IA and therefore its on-resistance effects the gain error of the IA. However, the output impedance of the IA remains relatively steady over wide frequency range since the signal amplification is obtained with no feedback. The ouput impedance can be also reduced by a following buffer amplifier.

An exemplary approach to a high accuracy amplifier and comparator is disclosed in the aforementioned "Operational Amplifier or Comparator Circuit with Minimized Offset Voltage and Drift" U.S. Pat. No. 4,749,953 dated 6/7/88 by the same inventor.

Figure 2:
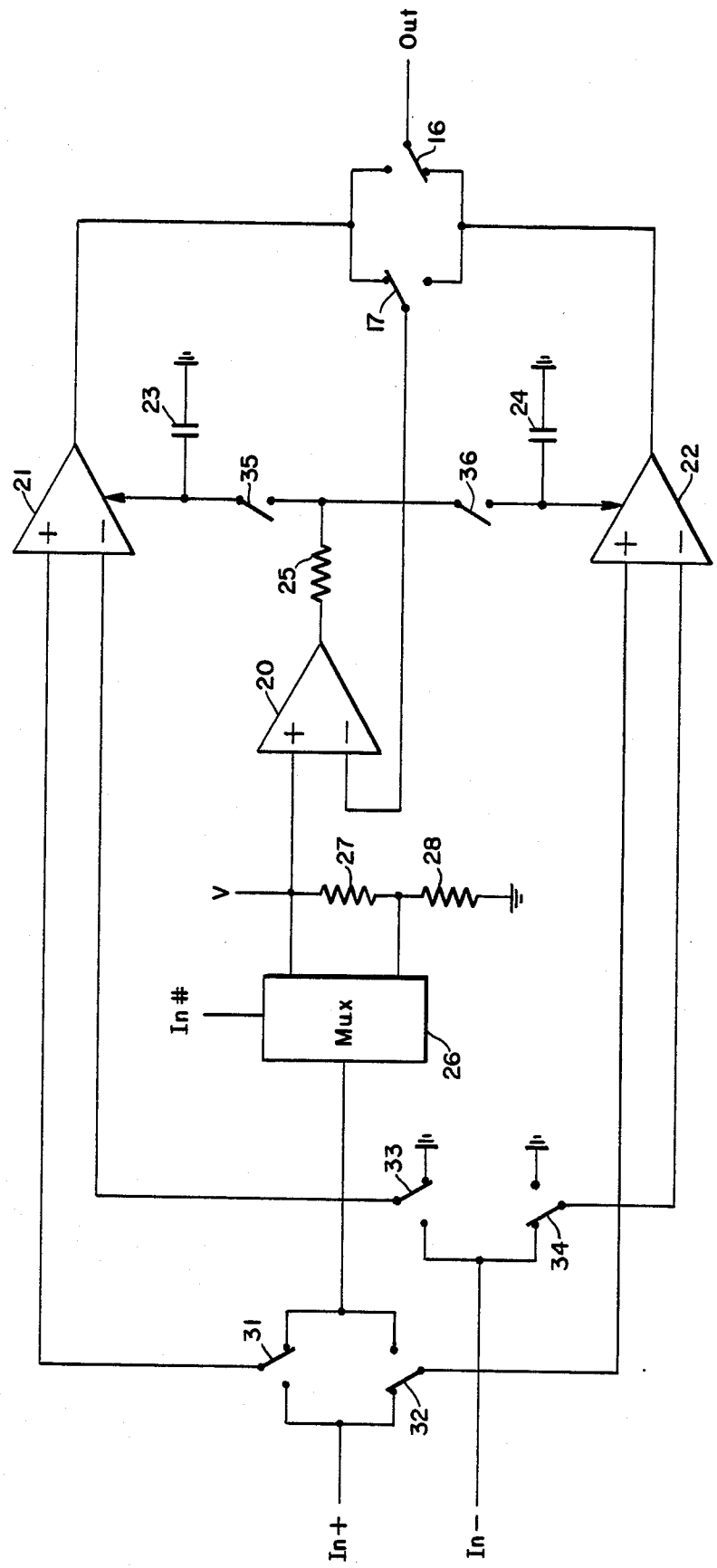
FIG. 2 is the preferred embodiment of the IA with digitally programmable gain.

FIG. 2 is the preferred embodiment of the IA with digitally programmable gain. The operational speed is very high, improved by the possibility of simultaneously amplifying the IA input signal by the amplifiers 21 and 22. The components 16, 17 and 20 thru 25 are coupled and operate basically as the respective components of FIG. 1, having the same reference numbers.

One of the amplifiers is amplifying the input signal and providing the output signal of the IA, wherein the voltage determining the gain of the amplifier is stored in a capacitor coupled thereto. Simultaneously, the comparator circuit is correcting the gain of the other amplifier by correcting a voltage across another capacitor, coupled thereto. When the correction is accomplished, the IA input signal is applied to both amplifiers and the comparator output is temporarily disconnected. Finally, the outputs of the amplifiers are switched. By these means, limited settling time of the amplifiers does not affect the performance of the IA during the switching.

Specifically, FIG. 2 shows the IA with the input signal applied via the switches 32 and 34 to respectively the noninverting and inverting inputs of the amplifier 22. The output thereof is coupled via the switch 16 to the output of the IA for providing the output signal thereof. Concurrently, a second reference voltage is applied to the amplifier 21, wherein the noninverting and inverting inputs thereof are coupled to the output of the multiplexer 26 and ground via the switches 31 and 33 respectively. The output voltage of the amplifier 21 is applied via the switch 17 to the inverting input of the comparator 20.

The output of the comparator 20 is coupled via the resistor 25 and switch 35 to the grounded capacitor 23. The voltage thereacross determines the gain of the amplifier 21. The comparator 20 compares the output voltage of the amplifier 21 with the second reference voltage deriving from the multiplexer 26. The resistor divider comprises the resistors 27 and 28. One of the divider outputs is selected by the multiplexer 26 in response to a digital signal applied to the In# input thereof. Due to a negative feedback, a gain of the amplifier 21 is obtained so that at the output thereof a voltage appears substantially equal to the reference voltage of the source V. The comparator 20 is held at its switching point and oscillates, whereby the voltage across the capacitor 23 is stable. Obviously, the gain of the amplifier 21 must be greater than one as to amplify a portion of the reference voltage divided by the resistors 27 and 28.

When the correction is terminated, the switches 31, 33 and 35 are switched so that the IA input voltage is applied to the amplifiers 21 and 22, and the output signal of the comparator 20 is interrupted. The amplifier 22 is still providing the IA output signal while the amplifier 21 is settling in response to the IA input signal. Finally, the switches 32, 34, 36, 16 and 17 are switched so that the amplifier 21 is providing the IA output signal and the gain of the amplifier 22 can be corrected. The absolute values of the resistors 27 and 28 are insignificant as merely their ratio determines the selected gain of the IA.

Figure 3:
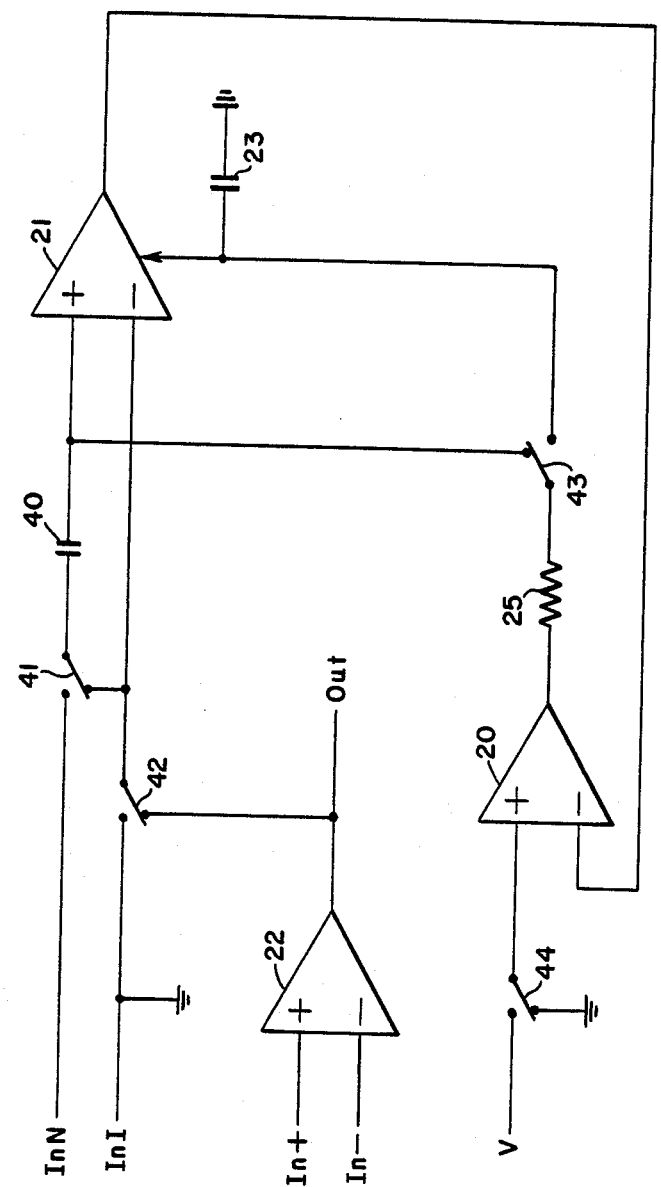
FIG. 3 is an embodiment of a circuit for automatic error voltage adjustment.

The gain of the IA is set by the second reference voltage deriving from the multiplexer 26. However, this voltage can be preset, e.g. manually, or any other voltage source can be used. For instance, the multiplexer 26 and the resistors 27 and 28 can be substituted for a digital-to-analog converter, wherein the source V may provide the reference voltage thereto. The ratio of the reference voltage to the output voltage of the converter determines the gain of the IA. FIG. 3 is an embodiment of a circuit for automatic error voltage adjustment and is intended to be a part of the FIG. 1 and/or 2 embodiments. For the purpose of clarity, the components 20 thru 23 and 25 are operating in the same manner and have the same reference numbers. The adjustment takes place prior to the gain correction, wherein the respective switches are set for an execution thereof as disclosed hereinabove. Therefore, only the new switches 41 thru 44 are shown and InI is coupled to ground. Obviously, components analogous to 40 thru 43 are required to adjust the error voltage of the amplifier 22. The comparator 20, resistor 25 and switch 44 are employed in either case.

The terminals InN and InI may be coupled like respectively the noninverting and inverting inputs of the amplifiers 21 of FIGS. 1 and 2. The output of the amplifier 21 is coupled to the inverting input of the comparator 20. The amplifier 22 is amplifying the input signal and providing the output signal of the IA, as shown. The switches 41 thru 44 are shown as set for the error voltage adjustment.

The capacitor 40 is coupled in series with the noninverting input of the amplifier 21 for storing the error voltage thereof. During the adjustment the capacitor 40 is coupled via the switch 41 across the inputs of the amplifier 21. The output voltage thereof is compared against ground potential by the comparator 20 whose noninverting input is now coupled to ground via the switch 44. The binary output signal of the comparator 20 is filtered by the resistor 25 and capacitor 40. Due to a negative feedback a voltage thereacross equal to the error voltage is obtained, whereby a voltage substantially equal to the ground potential appears at the ouput of the amplifier 21. The comparator 20 is held at its switching point and oscillates, whereby the voltage across the capacitor 40 is stable.

The output of the comparator 20 is coupled via the resistor 25 and switch 43 to the capacitor 40 and the noninverting input of the amplifier 21. The inverting input thereof obtains the IA ouput voltage deriving from the output of the amplifier 22 via the switch 42. By these means, dynamically generated errors can be reduced. If during the gain correction and error voltage adjustment the changes of the input common mode voltage (CMV) are small, a significant improvement of the CMR results, including a frequency response thereof. The switch 42 is superfluous if no adjustment of the CMR is necessary, whereby the inverting input of the amplifier 21 is coupled to ground.

By the end of the error voltage adjustment, the switches 41 through 44 are switched so that the terminals InN and InI act as respectively the noninverting and inverting inputs of the amplifier 21, as pointed out hereinabove. Thereby, the error voltage of the amplifier 21 is cancelled out as the voltage appearing between the inverting input thereof and InN is the difference of the error voltage and the voltage stored in the capacitor 40. The result is substantially equal zero, wherein the error voltage changes due to the temperature drift are very slow. By these means, the minimum offset voltage and drift are achieved. The values of the resistor 25 and capacitor 40, and the on-resistance of the switches 41 thru 44 are not essential. Amplifiers 21 and 22 with FET input stages are recommended as their very large offset voltage and drift can be nulled.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Instrumentation amplifier, comprising:
a pair of amplifier means each having a pair of inputs, a terminal and an output, for amplifying a signal applied across the inputs at a gain controlled by a signal applied to the terminal;
a pair of capacitive means separately coupled to the amplifier means terminals for storing the respective gain controlling signals;
a source means for providing a reference signal;
a comparator means having an input for comparing a signal applied thereto against the reference signal, and an output;
an input switch means for applying an input signal of the instrumentation amplifier across the inputs of at least one amplifier means or separately applying the input signal and the reference signal across the inputs of the amplifier means; and an output switch means for coupling the output of one amplifier means receiving the input signal of the instrumentation amplifier for providing an output signal thereof, and for coupling the terminal and output of the other amplifier means to respectively the output and input of the comparator means.

2. Amplifier of claim 1, wherein the input switch means includes two pairs of switches, each pair separately coupled to the pair of the amplifier means inputs for alternately applying thereacross the reference signal or the input signal of the instrumentation amplifier.

3. Amplifier of claim 1, wherein the input switch means applies the input signal of the instrumentation amplifier across the inputs of each amplifier means, and further wherein the output switch means temporarily disconnects the output of the comparator means, and exchanges the outputs of the amplifier means.

4. Amplifier of claim 1, wherein the source means provides a second reference signal to the input switch means.

5. Amplifier of claim 4, wherein the source means includes:
a resistive means for dividing the first said reference signal and providing a plurarility of third reference signals; and
a multiplexer means for selecting one of the third reference signals in response to a digital signal and providing the second reference signal.

6. Amplifier of claim 1, wherein at least one amplifier means exhibits an error voltage between the inputs thereof, and further including:
a second capacitive means coupled in series with one input of the one amplifier means for storing the error voltage thereof;
a second switch means for coupling the second capacitive means across the inputs of the one amplifier means and coupling the comparator means output to the one input thereof; and
a third switch means for substituting the reference signal applied to the comparator means for ground.

7. Amplifier of claim 6, further including a fourth switch means for applying the output signal of the instrumentation amplifier to the other input of the one amplifier means.

8. Amplifier of claim 1, wherein the comparator means includes a comparator having an output, and a resistor coupled in series therewith.

9. Amplifier of claim 1, wherein such capacitive means includes a capacitor coupled between the respective gain controlling signal and ground.

* * * * *